United States Patent
Xue et al.

(10) Patent No.: US 7,951,675 B2
(45) Date of Patent: May 31, 2011

(54) SI TRENCH BETWEEN BITLINE HDP FOR BVDSS IMPROVEMENT

(75) Inventors: Lei Xue, San Jose, CA (US); Aimin Xing, Hopewell Junction, CA (US); Chih-Yuh Yang, San Jose, CA (US); Angela Hui, Fremont, CA (US); Chungho Lee, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 151 days.

(21) Appl. No.: 11/957,737

(22) Filed: Dec. 17, 2007

(65) Prior Publication Data

US 2009/0152669 A1  Jun. 18, 2009

(51) Int. Cl.
*H01L 21/336* (2006.01)
(52) U.S. Cl. .......... 438/262; 257/E21.657; 257/E21.658
(58) Field of Classification Search ........... 257/E21.657, 257/E21.658; 438/262
See application file for complete search history.

(56) References Cited

U.S. PATENT DOCUMENTS

| 2006/0211188 A1* | 9/2006 | Lusky et al. ............ 438/201 |
| 2007/0054463 A1* | 3/2007 | Ogawa ..................... 438/400 |
| 2008/0128774 A1* | 6/2008 | Irani et al. ............... 257/314 |

* cited by examiner

*Primary Examiner* — N Drew Richards
*Assistant Examiner* — Yu-Hsi Sun
(74) *Attorney, Agent, or Firm* — Turocy & Watson, LLP

(57) ABSTRACT

Memory devices having improved BVdss characteristics and methods of making the memory devices are provided. The memory devices contain bitline dielectrics on bitlines of a semiconductor substrate; first spacers adjacent the side surfaces of the bitline dielectrics and on the upper surface of the semiconductor substrate; a trench in the semiconductor substrate between the first spacers; and second spacers adjacent the side surfaces of the trench. By containing the trench and the first and second spacers between the bitlines, the memory device can improve the electrical isolation between the bitlines, thereby preventing and/or mitigating bitline-to-bitline current leakage and increasing BVdss.

19 Claims, 6 Drawing Sheets

SI TRENCH BETWEEN BITLINE HDP FOR BVDSS IMPROVEMENT

TECHNICAL FIELD

Described are memory devices having improved drain-source break down voltage (BVdss) characteristics and methods of forming the memory devices.

BACKGROUND

Modern computing devices utilize a variety of kinds of memory devices to store and access information. Memory devices include the general classes of random access memories (RAM) and read only memories (ROM). These classes further contain static RAM (SRAM), dynamic RAM (DRAM), programmable ROM (PROM), electrically programmable ROM (EPROM), electrically erasable PROM (EEPROM), as well as FLASH memory, and the like. Most memory devices employ an internal architecture in the form of an array memory of bit cells, containing plural rows and plural intersecting columns.

A memory cell is placed at each intersecting row and column in the array. Typically, a particular memory cell is accessed by activating its row and then reading or writing the state of its column. Memory sizes are defined by the row and column architecture. For example, a 1024 row by 1024 column memory array defines a memory device having one megabit of memory cells. The array rows are referred to as wordlines and the array columns are referred to as bitlines.

The trend in semiconductor memory devices has been toward higher circuit density with higher numbers of bit cells per device, lower operating voltages, and higher access speeds. To achieve these high densities there have been, and continue to be, efforts toward scaling down device dimensions (e.g., at sub-micron levels). However, as scaling down device dimensions, bitline-to-bitline leakage may undesirably increase. Further, bitline contact misalignment may increase leakage current between the bitline and substrate silicon areas adjacent to the bitlines. To prevent bitline contact misalignment induced bitline-to-substrate leakage by ensuring that the bitline contact is formed over the bitline, an additional dopant implant can be utilized to increase the size of the bitline diffusion region after the contact has been etched. However, the increased bitline diffusion region may increase bitline-to-bitline leakage by decreasing the distance between bitlines. Thus, the requirement of small features with close spacing between adjacent features requires sophisticated manufacturing techniques.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the subject invention provides memory devices having improved BVdss characteristics. The memory devices contain bitline dielectrics on bitlines of a semiconductor substrate; first spacers adjacent the side surfaces of the bitline dielectrics and on the upper surface of the semiconductor substrate; a trench in the semiconductor substrate between the first spacers; and second spacers adjacent the side surfaces of the trench.

Another aspect of the subject invention provides methods of making memory devices having improved BVdss characteristics. The methods include forming first spacers adjacent side surfaces of bitline dielectrics and on an upper surface of a semiconductor substrate; forming a trench in the semiconductor substrate between the first spacers; and forming second spacers adjacent the side surfaces of the trench. By containing the trench and the first and second spacers between the bitlines, the memory devices and the methods of making the memory devices can improve the electrical isolation between the bitlines, thereby preventing and/or mitigating bitline-to-bitline current leakage and increasing BVdss.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
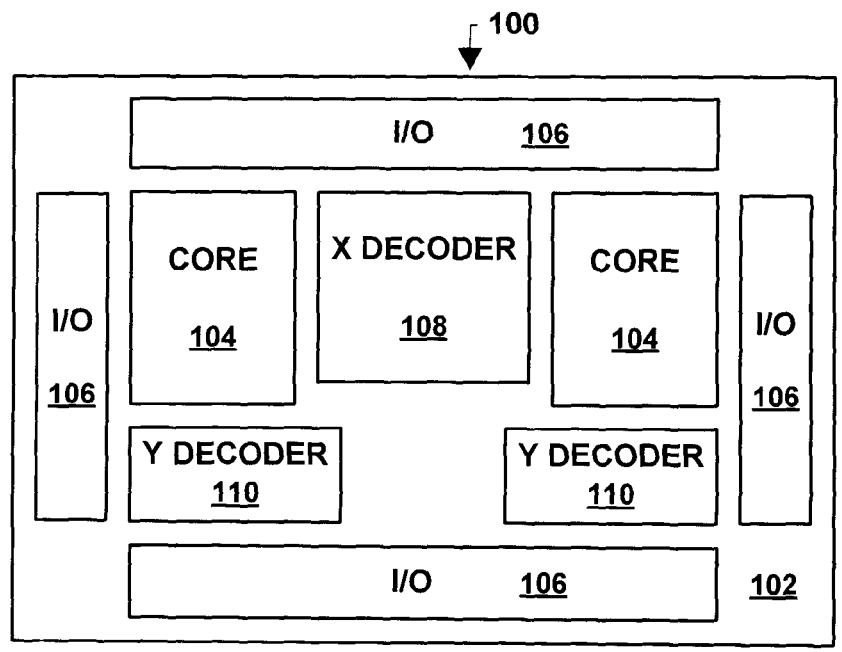
FIG. 1 is a top view of an exemplary memory device in accordance with an aspect of the subject invention.

A memory cell, for example, a single bit memory cell or a dual bit memory cell, is programmed by applying a relatively high programming voltage to a control gate and connecting a source to ground and a drain to a predetermined potential above the source. During this process, hot electrons in a core cell channel region near drain inject into the charge storage layer and become trapped since the charge storage layer is electrically isolated from control gate and substrate. As a result of the trapped electrons, the threshold voltage of the cell increases. This change in the threshold voltage (and thereby the channel conductance) of the cell created by the trapped electrons is what causes the cell to be programmed.

With memory devices shrinking in size, the shorter channel lengths of the smaller devices increasingly exhibit short channel behaviour that affects program operation. As the memory cells shrink, the BVdss also reduces, resulting in increased column leakage current originated from unselected wordline cells when the same programming voltage is applied at the selected bitline. The increased leakage current may load down the bitline driver and may increase power consumption. In a worst case, the intrinsic programming voltage may be pulled down and the program efficiency may be impaired.

The innovation described herein provides memory devices having increased BVdss and methods of forming the memory devices. In the memory device, the bitlines are separated from each other by a trench and spacers in a semiconductor substrate. By containing the trench in the semiconductor substrate and spacers in the trench, the memory device can improve the electrical isolation between the bitlines, thereby preventing and/or mitigating bitline-to-bitline current leakage and increasing BVdss. As the result, in one embodiment, the memory device does not need to contain a p-type semiconductor substrate between the bitlines to electrically separate the bitlines.

The BVdss solutions described herein can be applied to any suitable type of memory cell. For example, the BVdss solutions described herein can be applied to single-level memory cells, multi-level memory cells, single bit memory cells, dual bit memory cells, quad bit memory cells, and the like. The dual bit memory is a relatively modern memory technology and allows multiple bits to be stored in a single memory cell. The dual bit memory cell is essentially split into two identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit storage of two bits.

A dual bit memory cell can have a semiconductor substrate with implanted conductive bitlines and a charge storage layer on the semiconductor substrate. The charge storage layer can contain one or more layers. For example, the charge storage layer can contain three separate layers: a first insulating layer, a charge storage dielectric layer, and a second insulating layer. Wordlines can be formed over the charge storage layer substantially perpendicular to the bitlines. Programming circuitry can control two bits per cell by applying a signal to the wordline, which can act as a control gate, and changing bitline connections such that one bit is stored by source and drain being connected in one arrangement and a complementary bit is stored by the source and drain being interchanged in another arrangement.

The innovation is now described with reference to the drawings, wherein like reference numerals are used to refer to like elements throughout. In the following description, for purposes of explanation, numerous specific details are set forth in order to provide a thorough understanding of the innovation. It may be evident, however, that the innovation can be practiced without these specific details. In other instances, well-known structures and devices are shown in block diagram form in order to facilitate describing the innovation.

Although the BVdss solutions can be applied to any type of memory cell, the innovation is hereinafter illustrated and described in the context of an exemplary semiconductor device having one or more memory arrays containing dual bit memory cells arranged in a virtual ground type array architecture. FIG. 1 illustrates a top view of an exemplary dual bit flash memory device 100. The memory device 100 generally includes a semiconductor substrate 102 in which one or more high-density core regions 104 and one or more lower-density peripheral regions are formed. The high-density core regions 104 typically include one or more M by N arrays of individually addressable, substantially identical dual bit memory cells. The lower-density peripheral regions on the other hand typically include input/output (I/O) circuitry 106 and programming circuitry for selectively addressing the individual memory cells. The programming circuitry is represented in part by and includes one or more x-decoders 108 and one or more y-decoders 110 that cooperate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
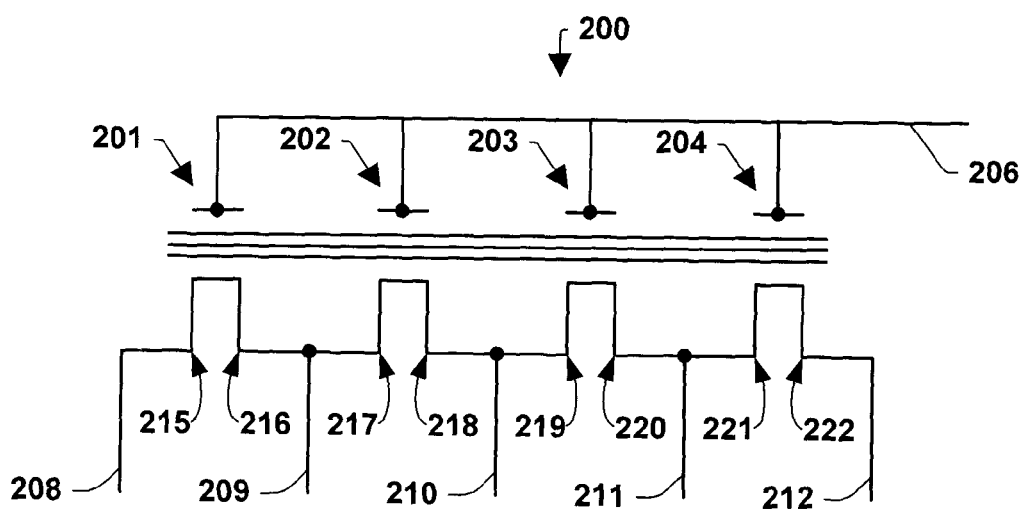
FIG. 2 is a schematic illustration of a portion of a memory core such as may include at least part of one of the cores depicted in FIG. 1 in a virtual ground type configuration in accordance with an aspect of the subject invention.

FIG. 2 is a schematic illustration of a portion 200 of an exemplary memory core such as may include at least part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a wordline 206, which serves as a control gate, and pairs of the memory cells share a common bitline. For instance, in the example shown, the memory cell 201 associates bitlines 208 and 209; the memory cell 202 associates bitlines 209 and 210; the memory cell 203 associates bitlines 210 and 211; and the memory cell 204 associates bitlines 211 and 212. As such, cells 201 and 202 share bitline 209, cells 202 and 203 share bitline 210 and cells 203 and 204 share bitline 211, respectively.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. It will be appreciated that although adjacent memory cells share common bitlines, the adjacent memory cells do not interfere with each other because the memory cells are typically programmed one at a time and in such instances only one memory cell is active at a time while programming.

Figure 3:
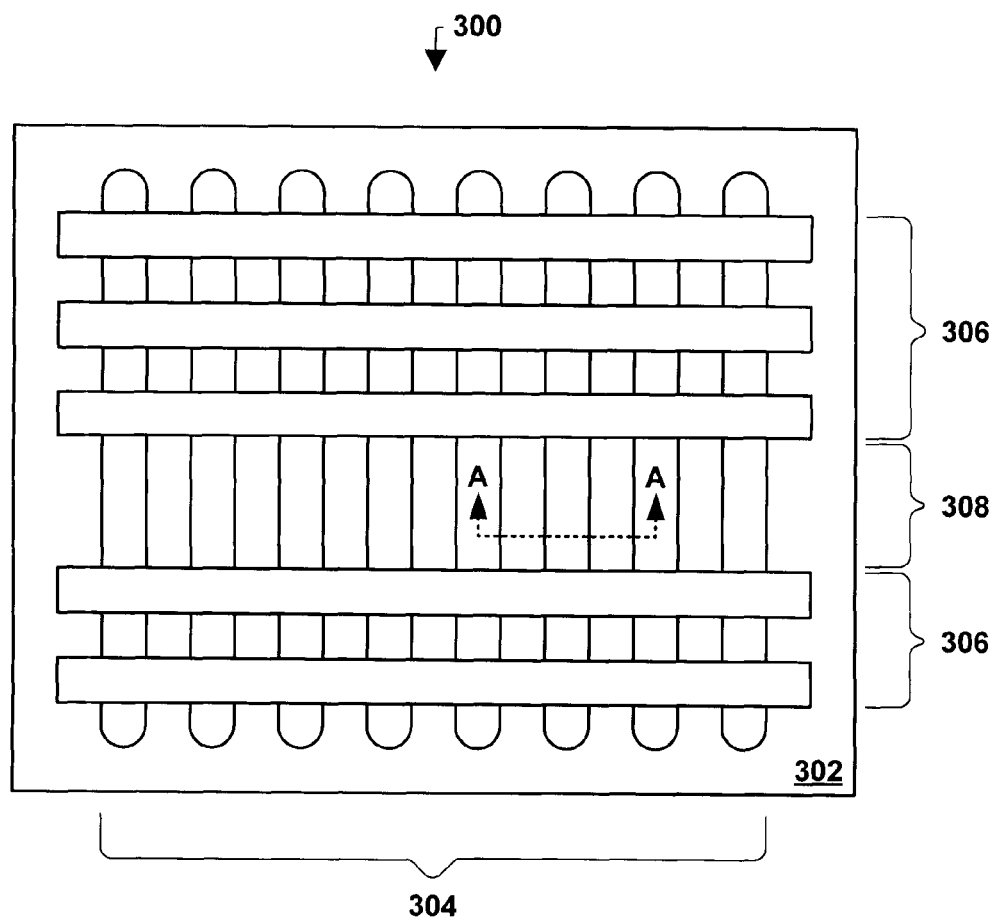
FIG. 3 is a top view of at least a portion of a memory core, such as may include at least part of one of the cores depicted in FIG. 1 in accordance with an aspect of the subject invention.

FIG. 3 illustrates a top view of at least a portion 300 of a memory core, such as may include at least part of one of the M by N array cores 104 depicted in FIG. 1. The memory core 300 is formed upon a semiconductor substrate 302 and has a plurality of implanted bitlines 304 extending substantially parallel to one another, and further includes a plurality of formed wordlines 306 extending substantially in parallel to one another and at substantially right angles to the plurality of implanted bitlines 304. The wordlines 306 are disposed over and separated from the bitlines 304 by a dielectric stack (not shown) in a grid arrangement. The memory core 300 includes a bitline contact region 308 between wordlines 306. The bitline contact region 308 can be used to establish electrical connection to the bitlines 304 through the dielectric stack. It will be appreciated that the bitlines 304 and wordlines 306 have contacts and interconnections (not shown) to programming circuitry such as may be represented, at least in part, by x-decoders and y-decoders.

Figure 4:
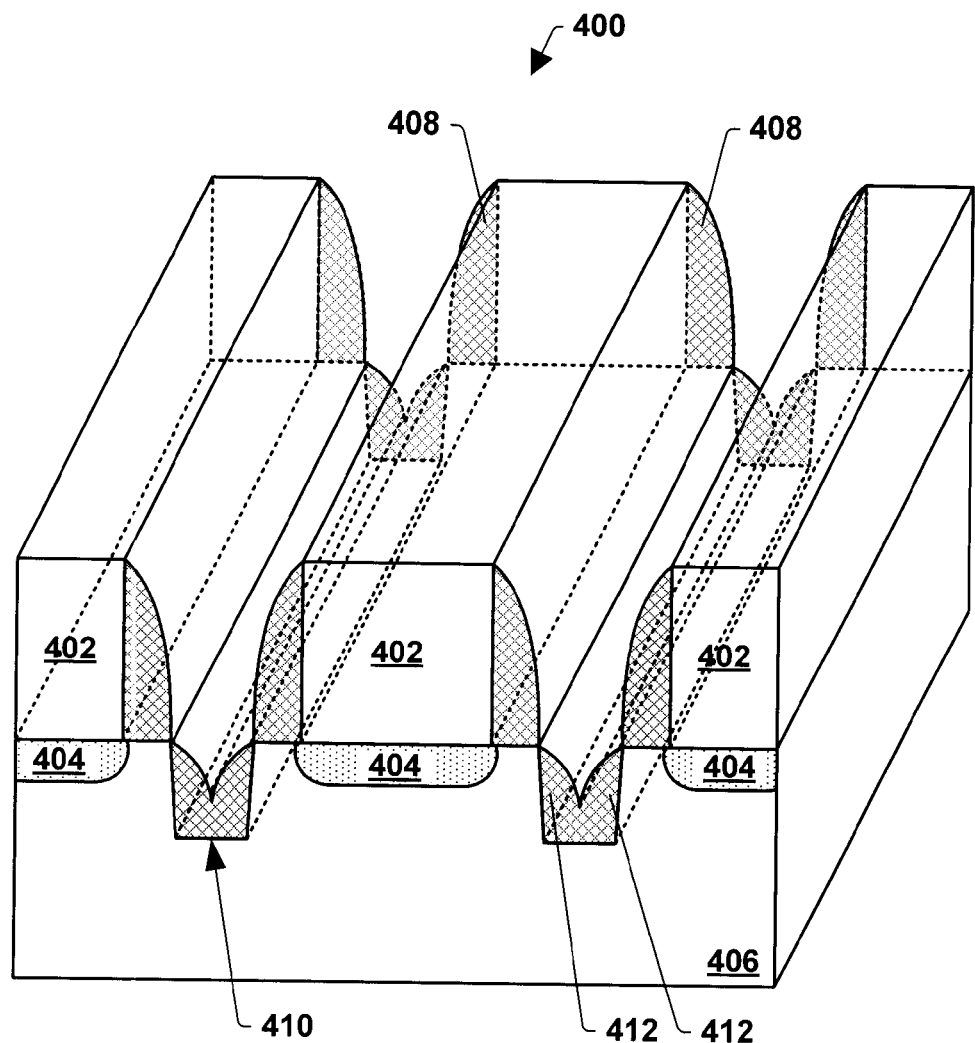
FIG. 4 is a cross-sectional isometric illustration of exemplary memory cells, such as that taken along line A-A of FIG. 3 in accordance with an aspect of the subject invention.

FIG. 4 is a cross-sectional isometric illustration of a portion of a bitline contact region of a memory device 400, such as that taken along line A-A of FIG. 3. The memory device 400 contains bitline dielectrics 402 on bitlines 404 of a semiconductor substrate 406 and first spacers 408 adjacent the side surfaces of the bitline dielectrics 402 and on the upper surface of the semiconductor substrate 406. In one embodiment, the memory device 400 contains the first spacers adjacent or on the side surfaces of the bitline dielectrics 402 and on the uppermost surface of the semiconductor substrate 406. The memory device 400 further contains a trench 410 in the semiconductor substrate 406 between the first spacers 408 and second spacers 412 adjacent the side surfaces of the trench 410. Although not shown in FIG. 4, the trench 410 can contain a dielectric layer under the second spacers. For example, the trench 410 can contain a dielectric layer containing oxides on the side surfaces and the bottom surfaces of the trench 410, and the second spacers 412 can be formed over the dielectric layer in the trench 410.

Although not shown in FIG. 4, the memory device 400 can contain one or more dual bit memory cells formed on the semiconductor substrate 406. The memory cell can contain a charge storage layer containing two charge storage nodes on the semiconductor substrate 406. In one embodiment, the two charge storage nodes are physically separated by a central dielectric in the charge storage layer. The memory cell can contain a first poly gate on the charge storage layer; a pair of bitlines adjacent the charge storage layer in the semiconductor substrate 406. The memory cell can contain a pair of buried bitlines and a channel between the pair of the buried bitlines in the semiconductor substrate 406. The buried bitlines can act as respective sources and drains for corresponding memory cells.

The charge storage layer is formed over the semiconductor substrate. The configuration and/or constituent of the charge storage layer may vary and are not critical to the subject invention. The charge storage layer generally can contain any suitable charge storage dielectric material. Examples of charge storage dielectric materials include nitrides (e.g., silicon nitride, silicon oxynitride, and silicon rich silicon nitride), oxides, silicates, a high-k dielectric, for example, having a dielectric constant higher than that of silicon dioxide ($SiO_2$), and the like. In one embodiment, the charge storage dielectric material contains silicon nitride, silicon oxynitride, and/or silicon rich silicon nitride. In another example, the charge storage material contains oxides or silicates containing Al, Ta, Hf, La, Zr, Ti, Nb, Cr, V, Y, Ce and/or Pr. The charge storage layer can be formed on the semiconductor substrate 406 by any suitable technique. For example, the charge storage layer can be formed by chemical vapor deposition (CVD), lithography, and etching techniques.

Specific examples of charge storage layer include an oxide/nitride/oxide tri-layer, an oxide/nitride bi-layer, a nitride/oxide bi-layer, an oxide/tantalum oxide bi-layer ($SiO_2/Ta_2O_5$), an oxide/tantalum oxide/oxide tri-layer ($SiO_2/Ta_2O_5/SiO_2$), an oxide/strontium titanate bi-layer ($SiO_2/SrTiO_3$), an oxide/barium strontium titanate bi-layer ($SiO_2/BaSrTiO_2$), an oxide/strontium titanate/oxide tri-layer ($SiO_2/SrTiO_3/SiO_2$), an oxide/strontium titanate/barium strontium titanate tri-layer ($SiO_2/SrTiO_3/BaSrTiO_2$), and the like.

In one embodiment, the charge storage layer can contain three separate layers: a first insulating layer, a charge storage dielectric layer, and a second insulating layer. The first and second insulating layers can contain an oxide dielectric such as silicon dioxide ($SiO_2$) and the charge storage dielectric layer can contain a nitride dielectric such as silicon nitride ($Si_xN_y$). The oxide/nitride/oxide configuration may be referred to as an ONO layer. Especially, when the nitride layer contains silicon rich silicon nitride, the oxide/nitride/oxide configuration may be referred to as an ORO tri-layer. The oxide/nitride/oxide tri-layer can be fabricated by forming a first silicon oxide layer, forming a silicon nitride layer on the first silicon oxide layer, and forming a second silicon oxide layer on the silicon nitride layer. In another embodiment, the charge storage layer can contain five separate layers, for example, oxide/nitride/polysilicon/nitride/oxide. The oxide/nitride/polysilicon/nitride/oxide configuration may be referred to as an ORPRO layer when the nitride layer contains silicon rich silicon nitride.

Since the memory cell has the two charge storage nodes, the memory cell can store two physically distinct bits. Each bit within the memory cell serves as a binary unit of data (e.g., either 1 or 0) that can be mapped directly to a memory array. Reading or programming one side of charge storage nodes can occur independently of whatever data is stored on the opposite side of the charge storage nodes.

Figure 5:
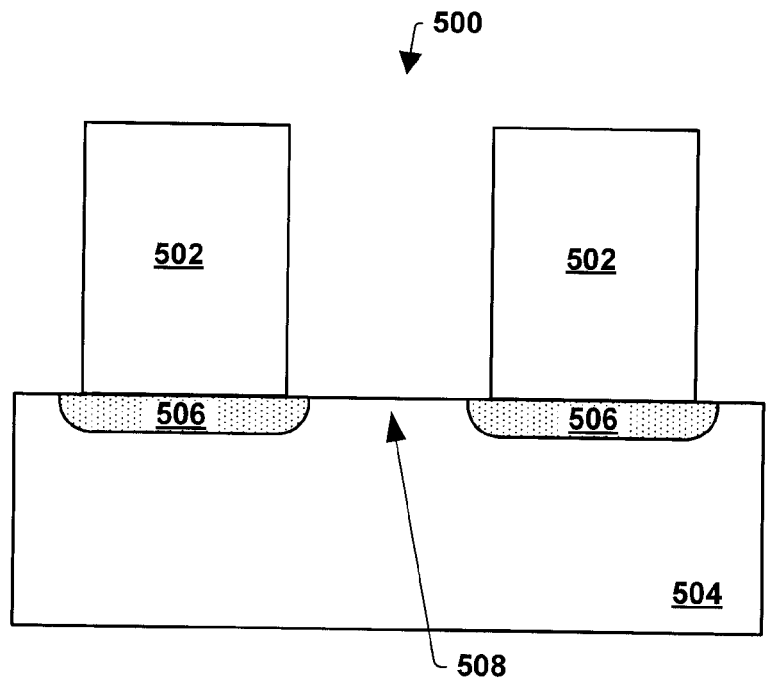
FIG. 5 illustrates a cross sectional view of an intermediate state of a portion of an exemplary memory device in accordance with an aspect of the subject invention.

Referring to FIGS. 5 to 8, one of many possible exemplary embodiments of forming a memory device is specifically illustrated. FIG. 5 illustrates a cross sectional view of an intermediate state of a portion of an exemplary memory device 500. The memory device 500 can contain bitline dielectric 502 on a semiconductor substrate 504 and bitline 506 in the semiconductor substrate 504.

The semiconductor substrate 504 may contain any suitable semiconductor material on which electric devices such as memory cell transistors can be formed. Examples of semiconductor materials include silicon, gallium arsenide, indium phosphide, and the like.

The bitline 506 can be formed in the semiconductor substrate 504 by any suitable technique. For example, a mask layer having a bitline opening (not shown) is formed on the semiconductor substrate 504 and then the bitline 506 is formed via implantation of one or more dopants. The dopants pass through the bitline opening and are implanted into the semiconductor substrate 504 under the bitline opening, leaving a channel region 508 of the semiconductor substrate 504 between the bitlines 506. Any suitable implant compositions and concentrations can be employed for the bitline 506. For example, the bitline 506 includes one or more n-type dopants (e.g., arsenic, phosphorous, antimony). Such dopants can be implanted at a dose of about 0.75E15 atoms/$cm^2$ or more and about 4E15 atoms/$cm^2$ or less and at an energy level of about 3 KeV or more, for example. Further, the semiconductor substrate 504 can contain other bitline implants.

The bitline dielectric 502 can contain any suitable dielectric material such as oxides. Examples of oxides include silicon oxide, hot temperature oxide (HTO), high density plasma (HDP) oxide, and the like. The bitline dielectric 502 can be formed by any suitable technique. For example, the bitline dielectric 502 is formed in a bitline opening of a patterned mask layer by forming a layer containing a bitline dielectric material over the semiconductor substrate 504 and removing an upper portion of the bitline dielectric layer down to the upper surface of the patterned mask layer. The bitline dielectric layer can be formed by any suitable technique.

In one embodiment, the bitline dielectric layer is formed by a HTO deposition process. For example, the HTO is formed by low pressure chemical vapor deposition (LPCVD) using nitrous oxide ($N_2O$) and dichlorosilane ($SiH_2Cl_2$) gasses at a temperature of about 600 degrees Celsius or more and about 900 degrees Celsius or less and a pressure of about 100 mTorr or more and about 500 mTorr or less. In another embodiment, the bitline dielectric layer is grown in plasma at low temperatures, e.g., plasma-grown oxide. For example, the bitline dielectric layer contains plasma-grown oxide that is grown at a temperature of about 250 degrees Celsius or more and about 600 degrees Celsius or less. The bitline dielectric layer may be formed by a HDP deposition process. In yet another embodiment, the bitline dielectric layer is formed using a Slot Plane Antenna (SPA) process. In the SPA process, plasma-grown oxide is grown in a chamber that includes a microwave slot antenna, which is used to generate the plasma. The microwave slot antenna can be configured to provide a plasma distribution that results in a plasma-grown oxide that has increased uniformity, conformity, and quality compared to conventional plasma oxide. In the SPA process, the species used to grow the oxide can contain one or more of oxygen, argon, or hydrogen, for example. The bitline dielectric layer can be optionally subjected to an anneal in, for example, a nitrogen ambient at about 1000 degrees Celsius for thirty minutes.

The upper portion of the bitline dielectric layer can be removed by any suitable technique. For example, the upper portion of the bitline dielectric layer is removed by chemical-mechanical polishing (CMP) and/or etching. For example, the upper portion of the bitline dielectric layer is polished by CMP under any suitable condition to facilitate removing/polishing the upper portion. The conditions generally depend upon, for example, the thickness of the bitline dielectric layer, the composition of the bitline dielectric layer, the desired implementations and/or the memory device 500 being fabricated, and the like. In another embodiment, the upper portion of the bitline dielectric layer is removed by contacting the upper portion with any suitable oxide etchant under any suitable condition that can remove the upper portion of the bitline dielectric layer but does not substantially damage and/or remove other components of the memory device 500. After formation of the bitline dielectric 502, the mask layer having the bitline opening can be removed.

Figure 6:
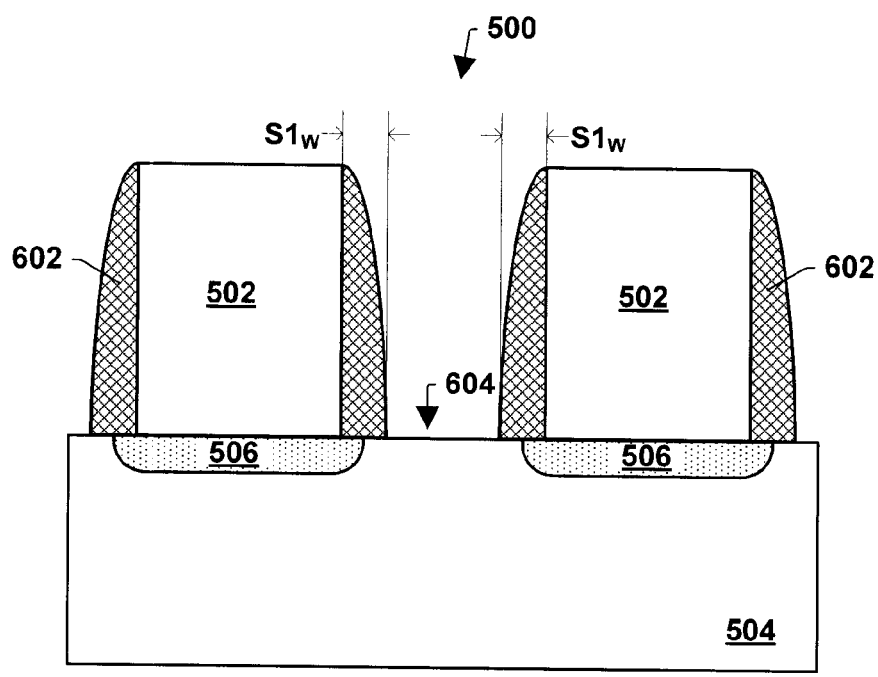
FIG. 6 illustrates forming first spacers adjacent side surfaces of bitline dielectrics and on an upper surface of a semiconductor substrate in accordance with an aspect of the subject invention.

FIG. 6 illustrates forming first spacers 602 adjacent the side surface of the bitline dielectric 502 and on the upper surface of the semiconductor substrate 504. In one embodiment, the first spacer 602 is formed adjacent the side surface of the bitline dielectric 502 and on the uppermost surface of the semiconductor substrate 504. The first spacer 602 may be referred to as a lightly doped drain (LDD) first spacer. After forming the two first spacers 602 between the bitline dielectrics 502, a portion 604 of the upper surface of the semiconductor substrate 504 that is not covered by the first spacers 602 is exposed. A trench is formed in the semiconductor substrate 504 between the first spacers in a subsequent process.

The first spacer 602 can contain any suitable dielectric material so that the first spacer 602 can prevent and/or mitigate bitline-to-bitline current leakage and increase BVdss. Examples of dielectric materials include nitrides (e.g., silicon nitride, silicon oxynitride, and silicon rich silicon nitride), oxides, silicates, and the like. The first spacer 602 can also contain any suitable material so that the first spacer 602 can serve as a mask for protecting the covered portion of the semiconductor substrate 504 when forming a trench in the semiconductor substrate 504 in a subsequent process. That is, the first spacer material can be selected so that there is etch selectivity between the semiconductor substrate 504 and the first spacer 602. The first spacer material can have a lower etch rate than the semiconductor substrate 504 in a subsequent etching process. For example, an etching rate of a nitride material is markedly slower than an etching rate of a silicon material with respect to a silicon etchant. Accordingly, in one embodiment, the first spacer 602 contains a nitride material. Examples of nitride materials include silicon oxynitride, silicon nitride, and the like. In another embodiment, diamond-like carbon and/or silicon carbide can be employed as a first spacer 602.

The first spacer 602 can be formed by any suitable technique, for example, forming a layer containing the first spacer material over the semiconductor substrate 504 and then removing portions of the layer containing the first spacer material not near the side surface of the bitline dielectric 502. A layer containing the first spacer material can be formed at least over the side surface of the bitline dielectric 502. After forming the first spacer material layer, portions of the first spacer material layer can be removed, for example, etching. Any suitable etching can be used as long as the etching can leave a first spacer 602 adjacent the side surface of the bitline dielectric 502 and on the semiconductor substrate 504. Examples of etching include reactive ion etching, chemical plasma etching, or other suitable anisotropic etching utilizing a suitable chemistry.

Choice of a suitable process and reagents of etching depends on, for example, the first spacer material, the width and thickness of the first spacer material, the desired implementations and/or the memory device 500 being fabricated, and the like. In one embodiment, reactive ion etching is used with an appropriate etchant for the selected first spacer material. For example, when the first spacer 602 contains silicon nitride, examples of etchants include $CF_4$ or $CHF_3$. In another embodiment, when the first spacer 602 contains diamond-like carbon, examples of etchants include oxygen-based plasma. In yet another embodiment, when the first spacer 602 contains silicon carbide, examples of etchants include $CF_4$, $CH_2F_2$, or $C_2F_6$.

The first spacer 602 can have any suitable width ($S1_W$) that depends on, for example, the desired width of the subsequently formed trench, the desired implementations and/or the memory device 500 being fabricated. Since the first spacer 602 can serve as a mask for protecting the covered portion of the semiconductor substrate 504, the width ($S1_W$) of the first spacer 602 can control and/or determine a width of a trench that is formed in the semiconductor substrate 504 between the bitline dielectric 502 in a subsequent process as described below. The width ($S1_W$) of the first spacer 602 may be reduced during the subsequent process. When the width ($S1_W$) of the first spacer 602 is reduced during the subsequent process, the reduced width of the first spacer 602 can control and/or determine a width of the resultant trench. In one embodiment, the first spacer 602 has a width ($S1_W$) of about 1 nm or more and about 50 nm or less. In another embodiment, the first spacer 602 has a width ($S1_W$) of about 5 nm or more and about 40 nm or less. In yet another embodiment, the first spacer 602 has a width ($S1_W$) of about 10 nm or more and about 30 nm or less.

Figure 7:
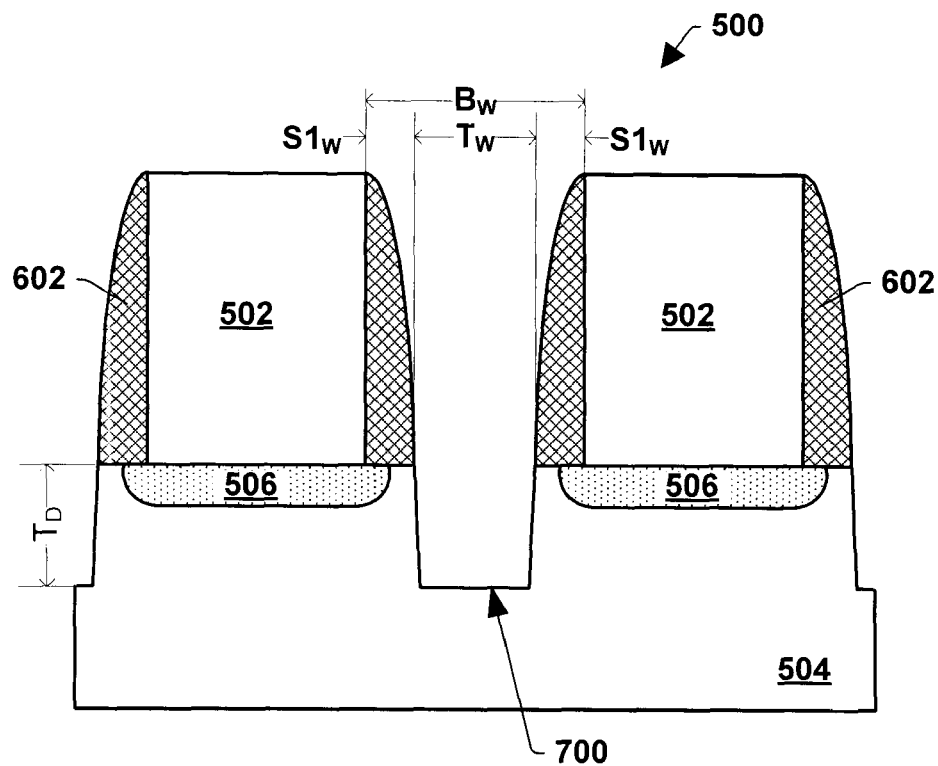
FIG. 7 illustrates forming a trench by removing portions of a semiconductor substrate that are not covered by first spacers in accordance with an aspect of the subject invention.

FIG. 7 illustrates forming a trench 700 by removing a portion 604 of the semiconductor substrate 504 that is not covered by the first spacer 602. The portion 604 of semiconductor substrate 504 can be removed by using the first spacers 602 as a mask.

The portion 604 of the semiconductor substrate 504 can be removed by any suitable technique, for example, etching. For example, the portion 604 of the semiconductor substrate 504 can be removed by contacting the semiconductor substrate 504 with any suitable etchant that does not substantially damage and/or remove other components of the memory device 500.

Wet etching and/or dry etching containing isotropic etching and/or anisotropic etching can be employed. Examples of wet etchants include tetraalkylammonium hydroxides (e.g., tetramethylammonium hydroxide (TMAH)) and alkali metal hydroxides (e.g., a potassium hydroxide (KOH) and cerium hydroxide (CeOH)). Examples of dry etching include reactive ion etching using, for example, a mixture gas containing HBr (e.g., HBr and $O_2$ mixture gas, HBr/$NF_3$/He and $O_2$ mixture gas, $SF_6$, HBr and $O_2$ mixture gas). The mixture may further include $Cl_2$. Other silicon etchants can also be used as long as they are capable of removing the exposed portions 604 of the substrate 504 selective to other components of the memory device 500 such as the first spacer 602. In one embodiment, when the first spacer 602 contains nitrides or oxides, the polysilicon etchant has a selectivity of about 1,000:1 or more for silicon versus nitrides or oxides. In another embodiment, the silicon etchant has a selectivity of about 5,000:1 or more for silicon versus nitrides or oxides.

The trench 700 can have any suitable width ($T_W$) that depends on, for example, the desired bitline pitch, the desired implementations, and/or the memory device 500 being fabricated. The width ($T_W$) of the trench 700 is generally equal to the width ($B_W$) between the bitline dielectrics 502 minus twice the width ($S1_W$) of the first spacer 602. In one embodiment, the trench 700 has a width ($T_W$) of about 2 nm or more and about 100 nm or less. In another embodiment, the trench 700 has a width ($T_W$) of about 10 nm or more and about 80 nm or less. In yet another embodiment, the trench 700 has a width ($T_W$) of about 20 nm or more and about 60 nm or less. In one embodiment, the width ($T_W$) of the trench 700 is less than the width ($B_L$) between the bitline dielectrics 502 by about 2 nm or more and about 100 nm or less. In another embodiment, the width ($T_W$) of the trench 700 is less than the width ($B_L$) between the bitline dielectrics 502 by about 10 nm or more and about 80 nm or less. In yet another embodiment, the width ($T_W$) of the trench 700 is less than the width ($B_L$) between the bitline dielectrics 502 by about 20 nm or more and about 60 nm or less.

The trench 700 in the semiconductor substrate 504 can have any suitable cross-sectional shape. In one embodiment, the trench 700 has relatively sloping sidewalls that extend perpendicular to the topological surface of the semiconductor substrate 504. In another embodiment, the trench 700 has relatively vertical sidewalls (not shown). The trench 700 can have any suitable depth. The depth ($T_D$) of the trench 700 may vary and is not critical to the subject invention. The depth ($T_D$) of the trench 700 may depend on, for example, the desired implementations and/or the memory device 500 being fabricated. In one embodiment, the depth ($T_D$) of the trench 700 is about 3 nm or more and about 350 nm or less. In another embodiment, the depth ($T_D$) of the trench 700 is about 10 nm or more and about 150 nm or less. In yet another embodiment, the depth ($T_D$) of the trench 700 is about 30 nm or more and about 130 nm or less.

Figure 8:
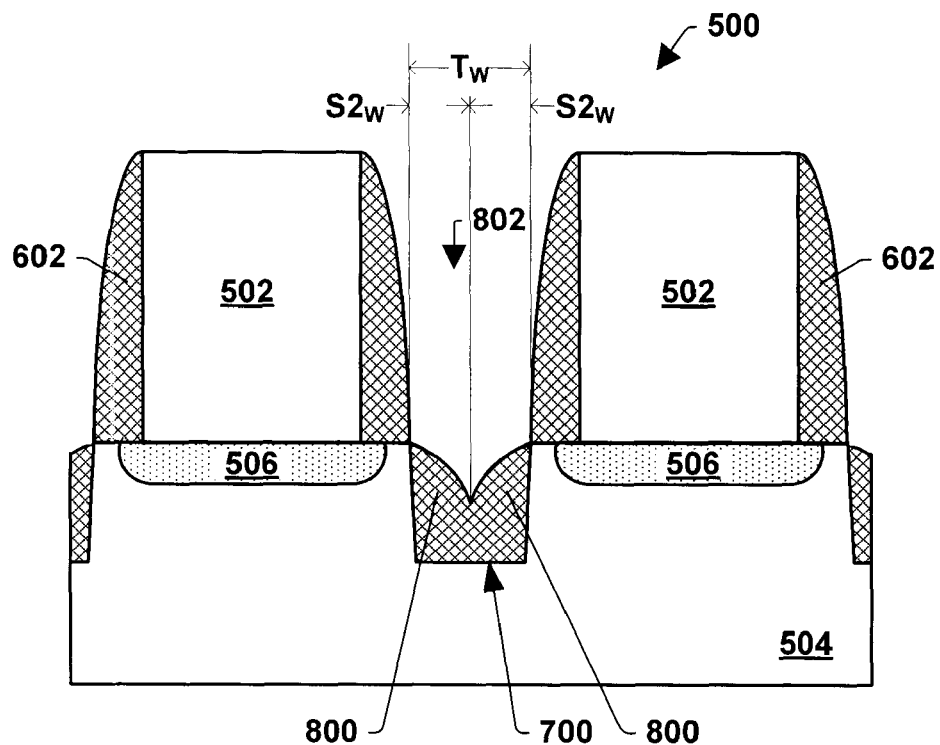
FIG. 8 illustrates forming second spacers adjacent the side surfaces of a trench in accordance with an aspect of the subject invention.

FIG. 8 illustrates forming second spacers 800 adjacent the side surface of the trench 700. The second spacer 800 can contain any suitable dielectric material so that the second spacer 800 can prevent and/or mitigate bitline-to-bitline current leakage and increase BVdss. For example, the second spacer 800 contains any of the materials of the first spacer 602 as described above in connection with FIG. 6. The second spacer 800 can be formed by any suitable technique, for example, forming a layer containing the second spacer material over the semiconductor substrate 504 and then removing portions of the layer containing the second spacer material not near the side surface of the trench 700. For example, the second spacer 800 is formed in the same manner as described above for forming the first spacer 602 in connection with FIG. 6.

The second spacer 800 can have any suitable width ($S2_W$) that depends on, for example, the desired implementations and/or the memory device 500 being fabricated. For example, any suitable amount of two second spacers 800 are formed adjacent the side surfaces of the trench 700. In one embodiment, the width ($S2_W$) of the second spacer 800 is about half of the width ($T_W$) of the trench 700. The bottom of the trench 700 can be filled with the two second spacers 800. In another embodiment, the two second spacers 800 contact with each other at the middle portion of the trench 700. In yet another embodiment, the two second spacers 800 contact with each other at the bottom of the trench 700 (not shown). In still yet another embodiment, the two second spacers 800 contact with each other at the upper portion of the trench 700 (not shown). In one embodiment, the second spacer 800 has a width ($S2_W$) of about 3 nm or more and about 50 nm or less. In another embodiment, the second spacer 800 has a width ($S2_W$) of about 5 nm or more and about 40 nm or less. In yet another embodiment, the second spacer 800 has a width ($S2_W$) of about 10 nm or more and about 30 nm or less.

The resultant memory device 500 contains the bitline dielectric 502 on the semiconductor substrate 504; the first spacer 602 adjacent the side surface of the bitline dielectric 502; and the bitline 506 in the semiconductor substrate 504. The semiconductor substrate 504 contains the trench 700 and the second spacer 800 adjacent the side surface of the trench 700. By containing the trench 700 and the first and second spacers 602, 800 between the bitlines 506, the memory device 500 can improve the electrical isolation between the bitlines 506, thereby preventing and/or mitigating bitline-to-bitline current leakage and increasing BVdss.

Although not shown in FIG. 8, the trench 700 can contain a dielectric layer under the second spacers 800. In one embodiment, a dielectric layer containing oxides is formed on the side surfaces and the bottom surfaces of the trench 700, and then the second spacers 800 are formed over the dielectric layer. In one embodiment, the dielectric layer has a thickness of about 1 nm or more and about 50 nm or less. In another embodiment, the dielectric layer has a thickness of about 5 nm or more and about 40 nm or less. In yet another embodiment, the dielectric layer has a thickness of about 10 nm or more and about 30 nm or less.

Although not shown in FIG. 8, the memory device 500 can further contain a dielectric at a space 802 between the bitline dielectrics 502 over the second spacer 800. For example, the memory device 500 contains oxides such as HDP oxides at the space 802.

Figure 9:
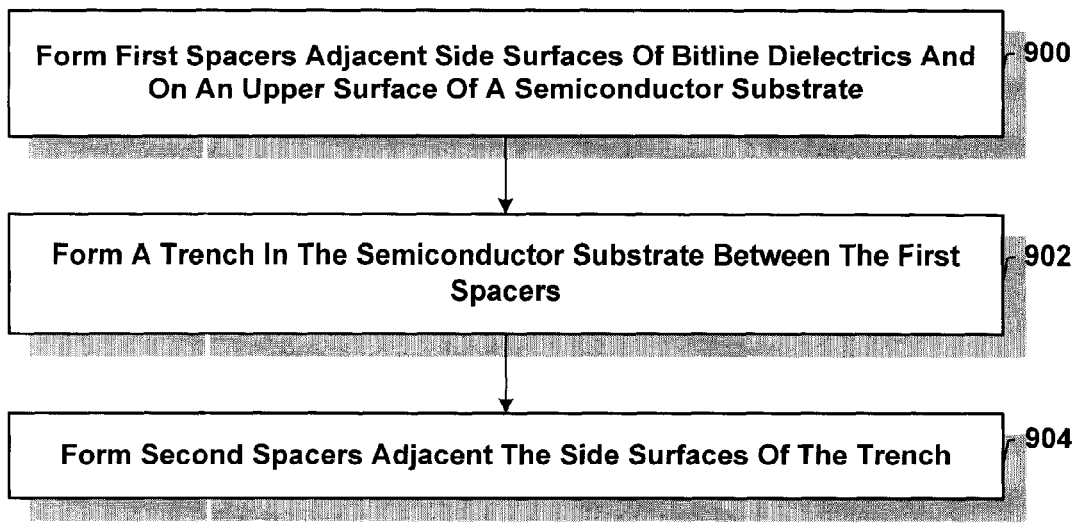
FIG. 9 illustrates an exemplary methodology of forming a memory cell having improved BVdss characteristics in accordance with an aspect of the subject invention.

FIG. 9 illustrates an exemplary methodology of forming a memory device having improved BVdss characteristics. At 900, first spacers are formed adjacent side surfaces of bitline dielectrics and on the upper surface of a semiconductor substrate. At 902, a trench is formed in the semiconductor substrate between the first spacers. At 904, second spacers are formed adjacent the side surfaces of the trench. In one embodiment, the method does not include forming a p-type semiconductor substrate between the bitline dielectrics. In another embodiment, the method further includes forming a dielectric layer on the side surface and the bottom surface of the trench. In yet another embodiment, the method further includes forming a dielectric between the bitline dielectrics over the second spacer.

Although not shown in FIG. 9, the methodology may include any suitable memory device fabrication processes. General examples of memory device fabrication processes include masking, patterning, etching, cleaning, planarization, thermal oxidation, implant, annealing, thermal treatment, and deposition techniques normally used for making memory devices.

The resultant memory device formed herein can be employed for central processing units (CPUs); volatile memory devices such as DRAM devices, SRAM devices, and the like; input/output devices (I/O chips); and non-volatile memory devices such as EEPROMs, EPROMs, PROMs, and the like.

The resultant memory device formed herein is useful in any electronic device. For example, the resultant memory device is useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

What is claimed is:

1. A memory device comprising:
    bitline dielectrics on bitlines of a semiconductor substrate having an upper surface,
    first spacers adjacent side surfaces of the bitline dielectrics and on the upper surface of the semiconductor substrate, a bottom surface of the first spacer being in contact with an uppermost surface of the semiconductor substrate,
    a trench having side surfaces in the semiconductor substrate between the first spacers, and
    second spacers adjacent the side surfaces of the trench,
    wherein an edge of the bottom surface of the first spacer is in contact with an upper edge of the second spacer and the bottom surface of the first spacer is directly in contact with an uppermost surface of a portion of the bitline in the semiconductor substrate.

2. The memory device of claim 1, wherein the memory device comprises at least one of single-level memory cells, multi-level memory cells, single bit memory cells, dual bit memory cells, or quad bit memory cells.

3. The memory device of claim 1, wherein the first spacer and the second spacer comprise silicon nitride.

4. The memory device of claim 1, wherein the first spacer and the second spacer have a width of about 1 nm or more and about 50 nm or less independently.

5. The memory device of claim 1, wherein the trench has a width of about 2 nm or more and about 100 nm or less.

6. The memory device of claim 1, wherein the width of the trench is less than the width between the bitline dielectrics by about 2 nm or more and 100 nm or less.

7. The memory device of claim 1, wherein the memory cell comprises the first spacers and the second spacers in a contact region.

8. The memory device of claim 1, wherein the bottom surface of the first spacer is directly in contact with the uppermost surface of the semiconductor substrate.

9. The memory device of claim 1, wherein a width of the trench is equal to a width between the bitline dielectrics minus twice a width of the first spacer.

10. The memory device of claim 1, wherein a width of the second spacer is one half of a width of the trench.

11. A method of electrically isolating bitlines from each other in a semiconductor substrate, comprising:
    forming first spacers adjacent side surfaces of bitline dielectrics and on an upper surface of the semiconductor substrate so that a bottom surface of the first spacer is in contact with an uppermost surface of the semiconductor substrate,
    forming a trench having side surfaces in the semiconductor substrate between the first spacers, and
    forming second spacers adjacent the side surfaces of the trench so that the side surfaces of the bitline dielectrics and the trench are covered with the first spacers and the second spacers, respectively and so that an edge of the bottom surface of the first spacer is in contact with an upper edge of the second spacer and the bottom surface of the first spacer is directly in contact with an uppermost surface of a portion of the bitline in the semiconductor substrate.

12. The method of claim 11, wherein the method does not comprise forming a p-type semiconductor substrate between the bitline dielectrics.

13. The method of claim 11, wherein the method comprises forming the first spacers and the second spacers in a contact region.

14. The method of claim 11, wherein the trench is formed by etching by using the first spacers as a mask.

15. The method of claim 11, wherein the first spacers are formed on the upper surface of the semiconductor substrate so that the bottom surface of the first spacer is directly in contact with the uppermost surface of the semiconductor substrate.

16. The method of claim 11, wherein the trench is formed in the semiconductor substrate so that a width of the trench is equal to a width between the bitline dielectrics minus twice a width of the first spacer.

17. A method of making a contact region of a memory device, comprising:
    forming bitlines in a semiconductor substrate,
    forming bitline dielectric on the bitlines,
    forming first spacers adjacent side surfaces of the bitline dielectrics and on an upper surface of the semiconductor substrate so that a bottom surface of the first spacer is in contact with an uppermost surface of the semiconductor substrate,
    forming a trench having side surfaces in the semiconductor substrate between the first spacers, and
    forming second spacers adjacent the side surfaces of the trench so that the side surfaces of the bitline dielectrics and the trench are covered with the first spacers and the second spacers, respectively and so that an edge of the bottom surface of the first spacer is in contact with an upper edge of the second spacer and the bottom surface of the first spacer is directly in contact with an uppermost surface of a portion of the bitline in the semiconductor substrate.

18. The method of claim 17, wherein the method does not comprise forming a p-type semiconductor substrate between the bitline dielectrics.

19. The method of claim 17, wherein the first spacers are formed on the upper surface of the semiconductor substrate so that the bottom surface of the first spacer is directly in contact with the uppermost surface of the semiconductor substrate.

* * * * *